United States Patent
Raimann et al.

(10) Patent No.: US 12,009,758 B2
(45) Date of Patent: Jun. 11, 2024

(54) HALF-BRIDGE FOR AN ELECTRIC DRIVE OF AN ELECTRIC VEHICLE OR A HYBRID VEHICLE, POWER MODULE FOR AN INVERTER AND INVERTER

(71) Applicant: ZF Friedrichshafen AG, Friedrichshafen (DE)

(72) Inventors: Manuel Raimann, Salem (DE); Sebastian Besold, Neudrossenfeld (DE); Gerhard Müller, Immenstaad (DE); Pengshuai Wang, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 341 days.

(21) Appl. No.: 17/484,953

(22) Filed: Sep. 24, 2021

(65) Prior Publication Data
US 2022/0109376 A1    Apr. 7, 2022

(30) Foreign Application Priority Data

Oct. 1, 2020  (DE) ..................... 10 2020 212 421.3
May 7, 2021  (DE) ..................... 10 2021 204 658.4

(51) Int. Cl.
*H02M 7/00* (2006.01)
(52) U.S. Cl.
CPC ................... *H02M 7/003* (2013.01)
(58) Field of Classification Search
None
See application file for complete search history.

(56) References Cited

U.S. PATENT DOCUMENTS 7,656,672 B2 * 2/2010 Schilling ................. H01L 24/49
361/752
9,978,672 B1 * 5/2018 Ahlers .............. H01L 23/49503
(Continued)

FOREIGN PATENT DOCUMENTS

CN    104734533 A  *  6/2015
CN    107403783 A  * 11/2017  ........... H01L 23/051
(Continued)

*Primary Examiner* — Timothy J. Dole
*Assistant Examiner* — Muhammed Azam
(74) *Attorney, Agent, or Firm* — Crowell & Moring LLP

(57) ABSTRACT

A half-bridge includes a substrate, semiconductor switches, power connections and signal connections. The power and signal connections are formed in a flat conductor frame. The signal connections are electrically connected to the semiconductor switches such that they can be switched via the signal connections and the power connections are electrically connected to the semiconductor switches such that they allow or interrupt electricity transfer between the power connections. The semiconductor switches, signal connections, and power connections are on a first surface of the substrate in a casting compound. First end sections of the signal connections formed in the flat conductor frame each extend from a second surface orthogonal to the first surface, exiting the casting compound. Second end sections of the signal connections, which are separate from the flat conductor frame, are connected to the first end section outside the casting compound and are perpendicular to the first surface.

13 Claims, 2 Drawing Sheets

(56) References Cited

U.S. PATENT DOCUMENTS

| | | | | |
|---|---|---|---|---|
| 2007/0252265 | A1* | 11/2007 | Sander | H01L 23/49575 257/691 |
| 2013/0043593 | A1* | 2/2013 | Domes | H01L 23/3735 257/E23.168 |
| 2017/0200666 | A1* | 7/2017 | Hable | H01L 23/3114 |
| 2019/0067151 | A1* | 2/2019 | Chen | H01L 23/5387 |
| 2021/0313296 | A1* | 10/2021 | Raimann | H01L 25/18 |
| 2021/0344276 | A1* | 11/2021 | Raimann | H01L 23/49575 |
| 2021/0392791 | A1* | 12/2021 | Sperber | H02K 11/33 |
| 2022/0109376 | A1* | 4/2022 | Raimann | H01L 23/49517 |
| 2022/0149752 | A1* | 5/2022 | Trenz | H01L 25/072 |
| 2022/0311349 | A1* | 9/2022 | Pahn | H02G 5/02 |

FOREIGN PATENT DOCUMENTS

| | | | | | |
|---|---|---|---|---|---|
| CN | 105958837 | B | * | 3/2019 | H02M 7/003 |
| CN | 113571502 | A | * | 10/2021 | H02M 7/003 |
| CN | 113725103 | A | * | 11/2021 | |
| CN | 114284251 | A | * | 4/2022 | H02M 7/003 |
| DE | 19833491 | A1 | * | 2/2000 | H02M 7/003 |
| DE | 10 2006 050 291 | | | 5/2007 | |
| DE | 10 2006 008 632 | | | 11/2007 | |
| DE | 102009054542 | A1 | * | 6/2010 | H01G 17/00 |
| DE | 102016117248 | A1 | * | 3/2018 | H01L 23/48 |
| DE | 10 2015 012 915 | | | 10/2020 | |
| DE | 102020208434 | A1 | * | 1/2022 | |
| DE | 102021203704 | A1 | * | 10/2022 | |
| EP | 0609706 | A2 | * | 8/1994 | |
| EP | 3598490 | A1 | * | 1/2020 | H01L 23/34 |
| WO | WO-2015003734 | A1 | * | 1/2015 | H01L 23/34 |

\* cited by examiner

HALF-BRIDGE FOR AN ELECTRIC DRIVE OF AN ELECTRIC VEHICLE OR A HYBRID VEHICLE, POWER MODULE FOR AN INVERTER AND INVERTER

CROSS-REFERENCE TO RELATED APPLICATIONS

This application claims priority from German Application No. DE 10 2020 212 421.3, filed on Oct. 1, 2020, and German Application No. DE 10 2021 204 658.4, filed on May 7, 2021, the entirety of which are each hereby fully incorporated by reference herein.

The invention relates to a power module for an inverter in an electric drive for an electric vehicle or hybrid vehicle according to the preamble of claim 1, and a corresponding inverter.

Purely electric vehicles as well as hybrid vehicles are known in the prior art, which are exclusively or partially driven by one or more electric machines functioning as drive systems. To supply the electric machines in these electric or hybrid vehicles with electricity, the electric and hybrid vehicles comprise electric energy storage units, in particular rechargeable batteries. These batteries form DC voltage sources, while electric machines normally require an AC voltage. For this reason, a power electronics with a so-called inverter is normally interconnected between a battery and an electric machine in an electric or hybrid vehicle.

These inverters normally comprise semiconductor switch elements, typically in the form of transistors. These semiconductor switch elements can be provided with different degrees of integration, specifically either as discreet individual switches with a low degree of integration, but higher scalability, as power modules with a high degree of integration but lower scalability, or as half-bridges, ranging between individual switches and half-bridges with regard to the degree of integration and scalability.

An electronic assembly is disclosed in DE 10 2006 050 291 A1, which comprises a semiconductor power switch and a semiconductor diode. A lower side of the semiconductor power switch comprises an output contact on a chip field on a carrier strip. An upper side of the semiconductor power switch comprises a control contact and an input contact. An anode contact for the semiconductor diode is located on the input contact on the semiconductor power switch and is electrically connected thereto. A cathode contact on the diode is electrically connected to the output contact on the semiconductor power switch.

DE 10 2006 008 632 A1 discloses a power semiconductor component that comprises a flat conductor frame, at least one vertical power semiconductor component, and at least one more electronic component. The vertical power semiconductor component has a first and second side. At least one first contact surface and at least one control contact surface are located on the first side. A least one second contact surface is located on the second side. The at least one other electronic component is located on the second contact surface on the vertical power semiconductor component.

A semiconductor module with at least two semiconductor elements is known from DE 10 2015 012 915 A1, each of which has at least one first electrode on a first side and at least a second electrode on a second side. The first semiconductor element is located above the second semiconductor element. An electrically conductive connection is located between the first semiconductor element and the second semiconductor element. The at least one second electrode on the first semiconductor element is mechanically and electrically connected to the electrically conductive connection. The at least one first electrode on the second semiconductor element is mechanically and electrically connected to the electrically conductive connection.

A power module is known from the not yet published DE 10 2019 220 010.9—the disclosure of which should be included in the present patent application—in which the signal connections and the power connections are all located on the same side of the substrate, and encompassed in a casting compound. The power connections and signal connections can all be accessed from the same side of the substrate, such that the power connections and the signal connections extend from the same side of the substrate through the casting compound, and are located within a base surface spanned by the substrate, seen from the direction they pass through the casting compound.

A power module is known from the not yet published DE 10 2020 205 420.7—the disclosure of which should be included in the present patent application—in which the power connections and signal connections are all formed in a flat conductor frame. Ends of the power connections and signal connections extend laterally from the casting compound and each have a right-angle bend, perpendicular to a surface along which the flat conductor frame extends.

These known power modules have disadvantages in that they are difficult to manufacture. To satisfy requirements regarding signal transfer, the signal connections are normally made of a material other than that of the conductor frame. The connecting of these two materials to one another increases the difficulty in their production. Furthermore, the ends of the signal connections lie in the surface of the flat conductor frame prior to the bend, and are first bent at a right angle after casting the substrate. As a result, the conductor frame must be larger than a minimum size. This means that it can only be made compact to a certain extent.

The object of the invention is to produce an improved half-bridge for an electric drive in an electric or hybrid vehicle.

This object is achieved according to the invention by the half-bridge, the power module, and the inverter according to the independent claims. Advantageous embodiments and developments of the invention can be derived from the dependent claims.

The invention relates to a half-bridge for an electric drive in an electric or hybrid vehicle. The half-bridge comprises a substrate, semiconductor switch elements, power connections, and signal connections.

The substrate can be, e.g., a DBC (direct bonded copper) substrate, AMB (active metal brazing) substrate, or IM (insulated metal) substrate. The semiconductor switch elements are located on the substrate, in particular transistors and diodes, as well as the associated power connections and signal connections. The substrate is preferably rectangular, in particular in the form of a flat, plate-like rectangle, with two pairs of lateral edges. The substrate can also be square.

The semiconductor switch elements form a high side and a low side in the half-bridge. The high side comprises one or more semiconductor switch elements connected in parallel to one another, to which a comparatively high potential is applied when the half-bridge is in operation. The low side comprises one or more semiconductor switch elements connected in parallel to one another, to which a comparatively low electrical potential is applied when the half-bridge is in operation. The high side and low side are connected in series to one another.

The semiconductor switch elements are preferably bipolar transistors with insulated-gate electrodes and/or silicon carbide metal-oxide-semiconductor field-effect transistors. Bipolar transistors with insulated-gate electrodes are also known as IGBTs (insulated-gate bipolar transistors). Silicon carbide metal-oxide semiconductor field-effect transistors are known in general as SiC MOSFETs. These types of semiconductor switch elements are comparatively well suited for low-loss and quick switching, even with high amperages.

Each bipolar transistor with an insulated-gate electrode particularly preferably has a dedicated freewheeling diode. The freewheeling diodes protect their bipolar transistors with insulated-gate electrodes from inductive overvoltages, in particular when switching the transistors.

The power connections are electrically connected to power contacts integrated in the semiconductor switch elements, such that electricity can be transferred from one power connection through a semiconductor switch element to another power connection. Electricity is thus supplied to the electric motor for driving the electric or hybrid vehicle via the power connections.

The signal connections switch the semiconductor switching elements electrically, and are connected to the signal contacts on the semiconductor switch elements integrated in the semiconductor switch elements. Depending on the type of semiconductor switch element, the semiconductor switch elements can be switched between conducting current and blocking current by supplying a current or voltage to the signal contact. The semiconductor switch elements are preferably switched in this manner according to a pulse-width modulation (PWM), to enable a sinusoidal temporal curve of the phase currents.

The semiconductor switch elements, power connections, and signal connections in the power module according to the invention are preferably all located on a first surface of the substrate. The power connections and signal connections can then be easily placed in contact with external connection contacts. The first surface is preferably one of the two opposing, comparatively largest surfaces on the layered substrate.

The power connections and signal connections are formed by a flat conductor frame in the half-bridge according to the invention, preferably by stamping. This means that the power connections and signal connections are already formed in the flat conductor frame through pre-structuring, before the flat conductor frame is integrated in the half-bridge or the power module. To protect them from environmental effects, the semiconductor switch elements, power connections and signal connections are cast in a casting compound. The power connections and signal connections have external connection contacts, which extend outward through the casting compound. This enables an electrical contact to be obtained with the signal connections and power connections from outside the half-bridge.

The external connection contacts for the signal connections have a two-part construction according to the invention, and each comprise a first end section and a second end section. Prior to connecting them, both end sections are spatially separated from one another. The first end sections are formed in the flat conductor frame, preferably stamped therein. After casting the substrate, the first end sections each extend from the casting compound from a second surface that is orthogonal to the first surface. The second surface is a "lateral surface" of the cast, layered substrate, which is normally significantly smaller than the first surface. The first end sections of the external connection contacts for the signal connections are therefore parallel to the first surface.

After casting the substrate, the second end sections are bonded to their first end sections by means of a suitable bonding process. The second end sections are positioned such that they are perpendicular to the first surface.

As a result of the two-part construction of the external connection contacts for the signal connections there is a very economical possibility for producing the half-bridges according to the invention without impairing other substantial properties such heat dissipation, current distribution, or the installation size. The second end sections of the external connection contacts for the signal connections do not need to be formed in the flat conductor frame. The flat conductor frame can therefore be produced with a smaller surface area than the previously known power modules, in a particularly economical and compact manner.

The invention also relates to a power module that has at least three half-bridges according to the invention, wherein each half-bridge is preferably assigned one of at least three phases in an alternating current, which is generated by means of the power module on the basis of a direct current that it receives. The invention also relates to an inverter for an electrical drive for an electric or hybrid vehicle, which has such a power module. The power module and/or inverter preferably comprise a heatsink, which is also preferably attached to the undersurface of the substrate, and can contain cooling conductors, e.g. pin-fin structures, through which a coolant can flow. This results in the advantages of described in conjunction with the half-bridge according to the invention for the power module and inverter according to the invention as well.

The invention shall be explained by way of example below in reference to the embodiments shown in the figures. Therein:

The same objects, functional units and comparable components are given the same reference symbols in all of the figures. These objects, functional units and comparable components are identical with respect to their technical features, as long as not otherwise specified explicitly or implicitly in the description.

Figure 1:
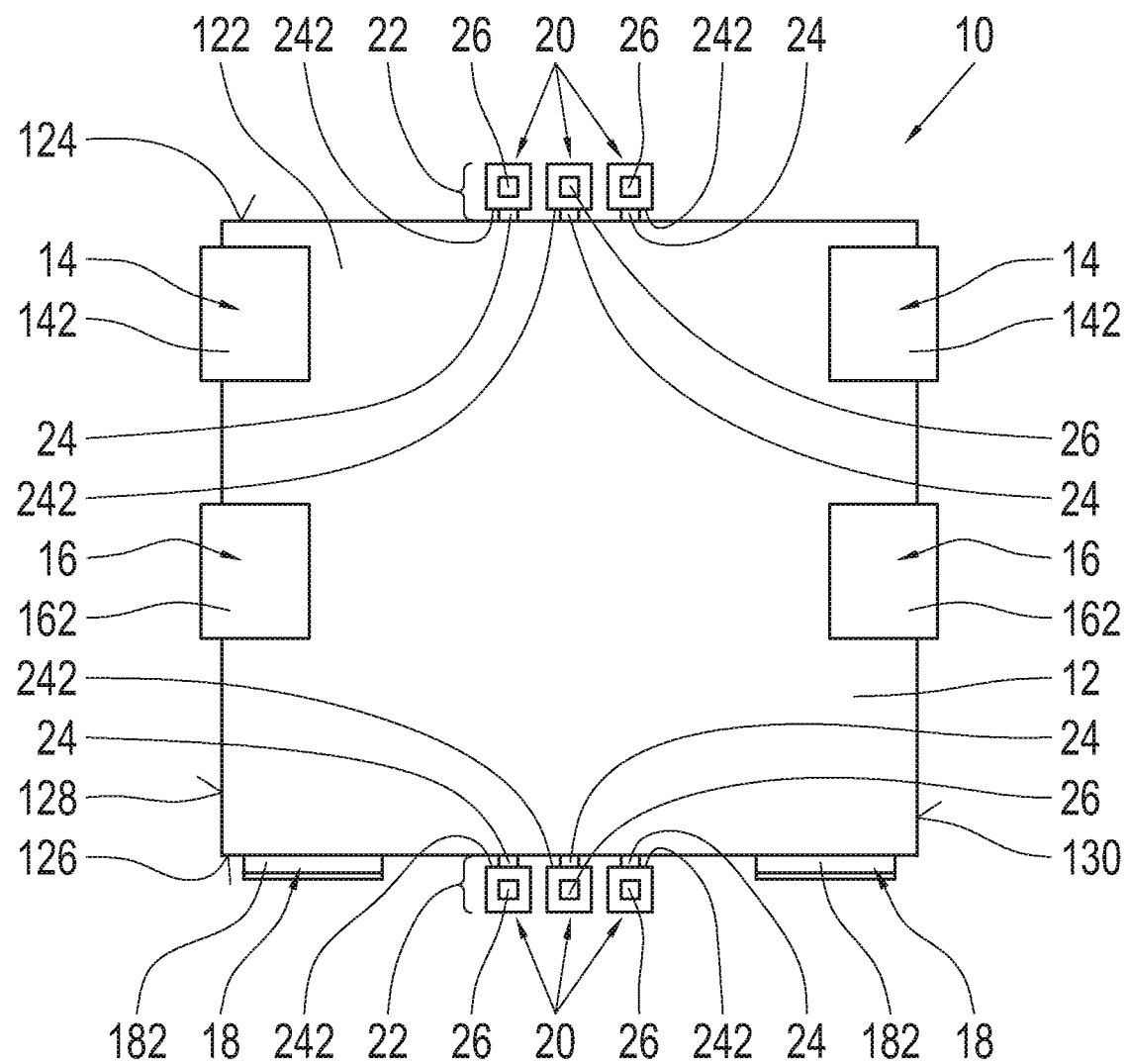
FIG. 1 shows, by way of example and schematically, one possible construction for a half-bridge according to the invention for an electric drive in an electric vehicle or a hybrid vehicle, in a top view.

FIG. 1 shows a schematic illustration of a half-bridge 10 according to the invention for an electric drive in an electric or hybrid vehicle, in a top view. The half-bridge 10 comprises a substrate, numerous semiconductor switch elements, numerous power connections 14, 16, 18, and numerous signal connections 20. The signal connections 20 are electrically connected to the semiconductor switch elements such that the semiconductor switch elements can be switched via the signal connections 20. The power connections 14, 16, 18 are electrically connected to the semiconductor switch elements such that the semiconductor switch elements allow or interrupt an electrical power transfer between the power connections 14, 16, 18.

The semiconductor switch elements, power connections 14, 16, 18, and signal connections 20 are located on a first surface of the substrate. The power connections 14, 16, 18 comprise two first power connections 14, preferably in the form of positive power connections 14, two second power connections 16, preferably in the form of negative power connections 16, and two third power connections 18, preferably in the form of phase power connections 18. The power connections 14, 16, 18 and signal connections 20 are formed on a flat conductor frame, preferably stamped therein. After attaching the semiconductor switch elements and flat conductor frame to the substrate, the substrate is cast in a casting compound 12 to protect it against environmental effects. The cast substrate is subsequently exposed in sections, such that the power connections 14, 16, 18 and signal connections 20 are located partially outside the casting compound 12.

As is shown by way of example in FIG. 1, the casting compound 12 has an upper surface 122 and a lower surface that is substantially parallel to the first surface of the substrate (not shown). The casting compound 12 also has two first lateral surfaces 124, 126, and two second lateral surfaces 128, 130, which are substantially perpendicular to the first surface. The first lateral surfaces 124, 126 are opposite one another. The second lateral surfaces 128, 130 are also opposite one another. In the substrate shown in the cast state in FIG. 1, first and second external connection contacts 142, 162 for the first and second power connections 14, 16 exit the casting compound 12 through the second lateral surfaces 128, 130. The third external connection contacts 182 for the third power connections 18 and external connection contacts 22 for the signal connections 20 also exit the casting compound 12 through the first lateral surfaces 124, 126.

The external connection contacts 142, 162, 182 for the power connections 14, 16, 18 each preferably have a right-angle bend. This allows for an electric contact to the power connections 14, 16, 18 to be established from above (i.e. starting from the side of the casting compound 12 facing the upper surface 122).

As shown by way of example in FIG. 1, the external connection contacts 22 for the signal connections 20 each have a two-part construction, and each comprise a first end section 24 and second end section 26. The first end sections 24 are part of the flat conductor frame from which the power connections 14, 16, 18 and signal connections 20 are formed, preferably by stamping. This means that the first end sections are made of the same material as the flat conductor frame. As shown by way of example in FIG. 1, the first end sections 24 each have a fastening plate 242 for attaching the second end sections 26, which are separate from the flat conductor frame. The fastening plates 242 are square here, by way of example. The second end sections 26 are unconnected signal conductor pins prior to attaching them to the respective first end sections 24. The signal conductor pins are connected to the associated first end sections 24 by means of a suitable bonding process, such that they resulting second end sections 26 are substantially perpendicular to the first surface of the substrate.

Figure 2:
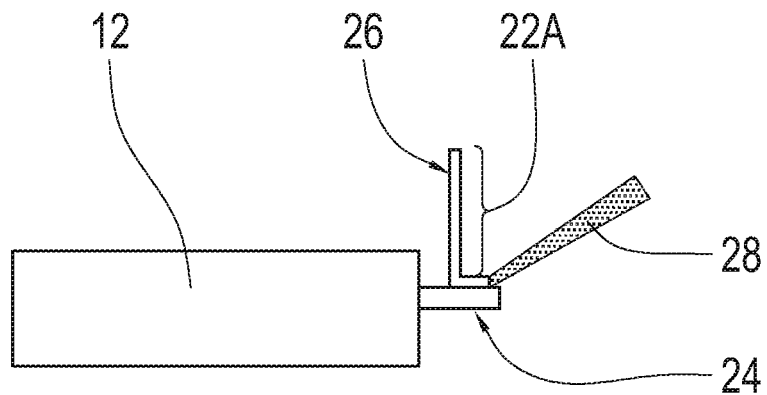
FIG. 2 shows, by way of example and schematically, one possible external connection contact for a signal connection in the half-bridge shown in FIG. 1, according to one embodiment.
Figure 3:
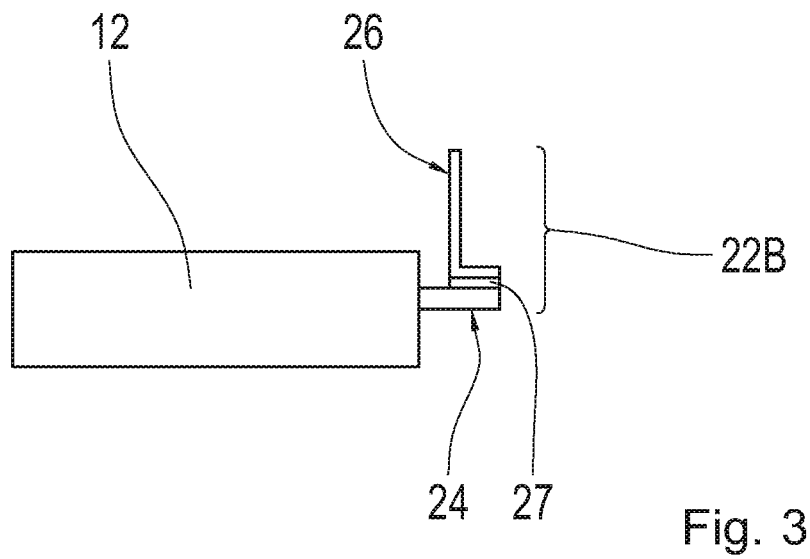
FIG. 3 shows, by way of example and schematically, one possible external connection contact for a signal connection in the half-bridge shown in FIG. 1, according to another embodiment.
Figure 4:
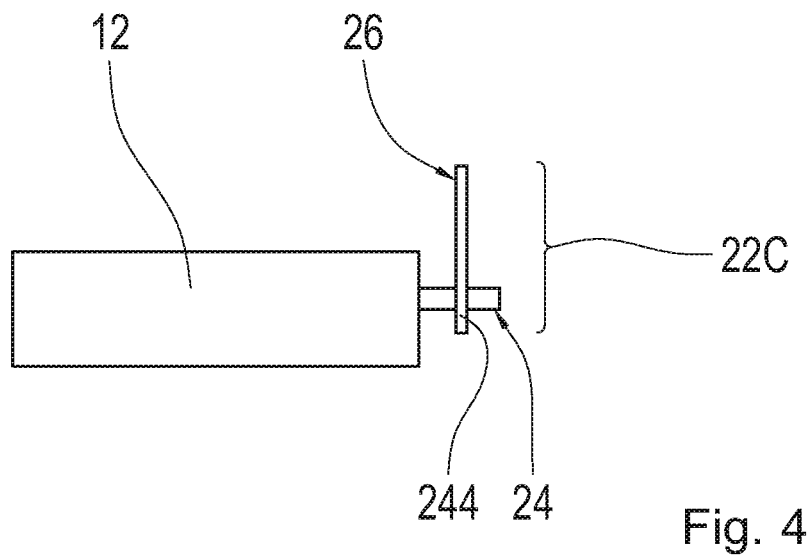
FIG. 4 shows, by way of example and schematically, one possible external connection contact for a signal connection in the half-bridge shown in FIG. 1, according to another embodiment.

FIGS. 2 to 4 each show on possible means of connecting the signal conducting pins to the first end sections 24 of the signal connections 20. FIG. 2 shows, schematically, an external connection contact 22a for a signal connection 20 according to one embodiment. The second end section 26 of the external connection contact 22A is obtained in that the associated signal conducting pin 26, which is in the shape of an L in this version, by way of example, and is separate from the flat conductor frame prior to connecting it, is welded at the shorter end to the top of the first end section 24, preferably with a laser welding process. In FIG. 2, a laser beam 28 is shown schematically to illustrate the laser welding process, which is directed toward the connecting point between the signal conductor pin 26 (the second end section 26) and the first end section 24.

FIG. 3 shows, schematically, an external connection contact 22B for one of the signal connections 20, according to another embodiment. The second end section 26 of the external connection contact 22B is obtained in that the associated signal conducting pin 26, which is in the shape of an L in this version, by way of example, and is separate from the flat conductor frame prior to connecting it, is attached at the shorter end to the top of the first end section 24 by means of soldering. A soldering paste 27 is shown in FIG. 3 in the connecting point between the signal conductor pin 26 (the second end section) and the first end section 24. Alternatively, the associated signal conductor pin 26 can be attached at the shorter end to the top of the first end section 24 by sintering.

FIG. 4 shows, schematically, an external connection contact 22C for one of the signal connections 20, according to another embodiment. The second end section 26 of the external connection contact 22A is obtained in that the associated signal conductor pin 26, which has an elongated shape in this version, by way of example, and is separate from the flat conductor frame prior to connecting it, is pressed into a hole 224 formed in the first end section 24, and secured in place by the friction between the outer surface of the signal conductor pin 26 and the inner surface of the hole 244. Alternatively, the signal conductor pin 26 can also have an outer threading (not shown) and the hole 244 in the first end section 24 can have an inner threading, such that the signal conductor pin 26 can be screwed into the hole 244, and secured by this means in the first end section 24.

The production method according to the invention, in which the second end sections 26 are not contained in the flat conductor frame, and are first connected to the first end sections 24 after placing the power connections 14, 16, 18 and the signal connections 10 in the half-bridge 12 and casting the substrate with the casting compound 12 and exposing the external connection contacts 142, 162, 182 for the power connections 14, 16, 18, and exposing the first end sections 24 of the signal connections 20, facilitates a simple productions of the flat conductor frame. This can be produced from a single material, e.g. a pure metal, such that the second end sections 26 do not need to be formed in the flat conductor frame, which are normally made of a metal alloy.

The flat conductor frame can also have a smaller surface area, thanks to the elimination of the second end sections. This results in a more compact structure for the half-bridge 10 and the power module (not shown), which comprises at least three half-bridges 10, each of which is assigned one of the phases of the multi-phase output current. A compact inverter (not shown) according to the invention, which comprises the power module, can therefore be obtained in a particularly simple manner.

REFERENCE SYMBOLS 10 half-bridge
12 casting compound
122 upper surface 124, 126 first lateral surfaces
128, 130 second lateral surfaces
14 first power connection
142 first external connection contact
16 second power connection
162 second external connection contact
18 third power connection
182 third external connection contact
20 signal connection
22, 22A-C external connection contact for the signal connection
24 first end section
242 fastening plate
244 hole
26 second end section
27 soldering paste
28 laser beam

The invention claimed is:

1. A half-bridge for an electric drive for an electric vehicle or hybrid vehicle, comprising:
    a substrate;
    semiconductor switch elements;
    power connections; and
    signal connections;
    wherein the power connections and the signal connections are formed in a flat conductor frame,
    wherein the signal connections are electrically connected to the semiconductor switch elements such that the semiconductor switch elements can be switched via the signal connections,
    wherein the power connections are electrically connected to the semiconductor switch elements such that the semiconductor switch elements allow or interrupt electricity transfer between the power connections,
    wherein the semiconductor switch elements, signal connections, and power connections are located on a first surface of the substrate and cast in a casting compound,
    wherein first end sections of the signal connections formed in the flat conductor frame each extend from a second surface of the substrate that is orthogonal to the first surface, exiting the casting compound, wherein second end sections of the signal connections, which are separate from the flat conductor frame, are connected to the first end section of the signal connections outside the casting compound, such that the second end sections are perpendicular to the first surface, and wherein holes are formed in the first end sections of the signal connections, in which the second end sections of the signal connections are inserted.

2. The half-bridge according to claim 1, wherein the flat conductor frame is made from a first material, and
    wherein the second end sections of the signal connections are made of a second material, which is different than the first material.

3. The half-bridge according to claim 2, wherein the first material is a pure metal, and wherein the second material is a metal alloy.

4. The half-bridge according to claim 1, wherein the second end sections of the signal connections are connected to the first end sections of the signal connections by means of welding.

5. The half-bridge according to claim 1, wherein the second end sections of the signal connections are connected to the first end sections of the signal connections by means of sintering.

6. The half-bridge according to claim 1, wherein the second end sections of the signal connections are connected to the first end sections of the signal connections by means of soldering.

7. The half-bridge according to claim 1, wherein the holes have inner threadings, wherein the second end sections form screws, and can be screwed into the holes.

8. The half-bridge according to claim 1, wherein external connection contacts for the power connections extend from the second surface of the substrate out of the casting compound, and each have a right-angle bend.

9. A power module for an inverter, comprising at least three half-bridges according to claim 1.

10. The inverter for an electric drive in an electric vehicle or hybrid vehicle, comprising the power module according to claim 9.

11. The half-bridge according to claim 1, wherein the power connections and the signal connections are formed in the flat conductor frame by stamping.

12. The half-bridge according to claim 1, wherein the holes are through holes.

13. The half-bridge according to claim 1, wherein the second end sections of the signal connections are pressed in place in the holes formed in the first end sections of the signal connections.

* * * * *